(12) United States Patent
Stevenson et al.

(10) Patent No.: US 7,658,822 B2
(45) Date of Patent: *Feb. 9, 2010

(54) SIO$_x$:SI COMPOSITE ARTICLES AND METHODS OF MAKING SAME

(75) Inventors: David E. Stevenson, Dexter, MI (US); Li Q. Zhou, Ann Arbor, MI (US)

(73) Assignee: Wintek Electro-Optics Corporation, Ann Arbor, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/201,781

(22) Filed: Aug. 11, 2005

(65) Prior Publication Data

US 2007/0037404 A1    Feb. 15, 2007

(51) Int. Cl.
*H01L 21/31* (2006.01)
(52) U.S. Cl. .................. 204/192.23; 204/298.12; 252/500
(58) Field of Classification Search ................. 510/108; 257/22; 117/21; 204/192; 501/53; 252/500
See application file for complete search history.

(56) References Cited

U.S. PATENT DOCUMENTS

| | | | | |
|---|---|---|---|---|
| 3,849,344 A * | 11/1974 | McMurtry et al. | ....... | 106/286.8 |
| 4,375,443 A | 3/1983 | Kipperman et al. | | |
| 4,451,969 A * | 6/1984 | Chaudhuri | ..................... | 438/62 |
| 4,859,553 A * | 8/1989 | Jansen et al. | ............... | 430/57.4 |
| 5,320,729 A | 6/1994 | Narizuka et al. | | |
| 6,177,284 B1 * | 1/2001 | Horii et al. | ...................... | 438/3 |
| 6,616,890 B2 * | 9/2003 | McPhillips | ................... | 264/642 |
| 6,730,934 B2 | 5/2004 | Yamada et al. | | |
| 6,911,163 B2 * | 6/2005 | Abe | ........................ | 252/521.3 |
| 7,037,581 B2 | 5/2006 | Aramata et al. | | |
| 2002/0190048 A1 * | 12/2002 | McPhillips | .................. | 219/270 |
| 2003/0118905 A1 | 6/2003 | Fukuoka et al. | | |
| 2004/0182700 A1 | 9/2004 | Natsume et al. | | |
| 2007/0034500 A1 * | 2/2007 | Stevenson et al. | ...... | 204/192.23 |
| 2007/0034837 A1 * | 2/2007 | Stevenson et al. | ........... | 252/500 |
| 2007/0037404 A1 * | 2/2007 | Stevenson et al. | ........... | 438/758 |

FOREIGN PATENT DOCUMENTS

| | | | |
|---|---|---|---|
| JP | 60-178618 | | 8/1985 |
| JP | 05-005177 | | 7/1991 |
| JP | 04-028858 A | | 1/1992 |
| JP | 04028858 A | * | 1/1992 |
| JP | 05-005117 A | | 1/1993 |
| JP | 10-062776 | | 3/1998 |
| JP | 2002-313307 | | 10/2002 |
| JP | 2004-119615 | | 4/2004 |
| JP | 2004119615 A | * | 4/2004 |
| JP | 2004323324 A | * | 11/2004 |
| WO | WO 03/082769 A1 | | 10/2003 |
| WO | WO 2004/048289 | | 6/2004 |

OTHER PUBLICATIONS

Office Action for U.S. Appl. No. 11/201,791, dated Jun. 22, 2009; USPTO.
Office Action for U.S. Appl. No. 11/201,782, dated Aug. 11, 2005; USPTO.

* cited by examiner

*Primary Examiner*—David Wu
*Assistant Examiner*—M. Reza Asdjodi
(74) *Attorney, Agent, or Firm*—Robert L. Stearns; Dickinson Wright, PLLC

(57) ABSTRACT

Article are made from silicon oxide and electrically conductive doped silicon materials that are joined in a protective environment to yield a composite SiO$_x$:Si material that exhibits the properties of SiO$_x$ and yet is electrically conductive due to the presence of the Si. Articles from such composite materials find many uses, such as for targets for DC and/or AC sputtering processes to produce silicon oxide thin films for touch-screen application, barrier thin films in LCD displays and optical thin films used in a wide variety of applications.

8 Claims, 1 Drawing Sheet ions of the uniformity of $SiO_2$ coatings that can be created with such method.

SIO$_x$:SI COMPOSITE ARTICLES AND METHODS OF MAKING SAME

BACKGROUND OF THE INVENTION

1. Technical Field

This invention relates to articles made of material compositions primarily composed of electrically non-conductive oxide silicon material in combination with fractions of materials that render the overall article electrically conductive.

2. Related Art

One important commercial application for such material compositions is thin film technology. Many architectural, automotive, integrated circuit, flat panel display and optical devices require thin films of oxide silicons ($SiO_x$), such as silicon dioxide ($SiO_2$).

One of the principal methods for producing such thin films is by a physical vapor deposition process known as radio frequency (RF) sputtering. This method utilizes non-conductive silicon dioxide material as the source material for the creation of the silicon dioxide thin film coatings. A high frequency ac-voltage, typically 13.56 MHz is applied capacitively to the target. In one phase, gas ions of the plasma are accelerated toward the target and cause material at the surface of the target to be detached as a result of the bombardment with the gas ions. In the other phase, the charge on the target surface is neutralized with the result that no sputtering occurs during this periodic phase. Although this method produces suitable silicon dioxide thin film coatings, it has the limitations of requiring the use of expensive and complex high frequency power supplies, low deposition rates for the formation of the $SiO_2$ thin film coatings, and inherent limitations on the uniformity of $SiO_2$ coatings that can be created with such method.

Direct current (DC), including pulsed DC, or medium to low frequency alternating current (AC) sputtering processes do not have such limitations. However, DC and AC processes require the use of silicon as the source material for the SiO2 coating. To utilize silicon as the deposition source material, it must be made sufficiently electrically conductive either by doping with a suitable dopant such as boron, or by the addition of small amounts of aluminum or other suitable metals. To use such silicon targets to create $SiO_2$ thin films via DC or AC sputtering also requires that large amounts of oxygen be introduced into the sputtering process. The resultant process is referred to as reactive sputtering. The oxygen reacts with the silicon during the sputtering process to yield $SiO_2$. To create $SiO_2$ films typically requires that $O_2$ gas pressure be 30- 50% of the total gas pressure in the vacuum chamber. This can result in a significant process mismatch in terms of the oxygen requirements, as compared to that required for other sputtered thin films which may be deposited using the same vacuum vessel. The presence of significant levels of $O_2$ in the chamber further slows the rate of deposition through collisions with the sputtered material. In addition, $SiO_2$ films made by DC and AC sputtering from silicon or Si:Al targets generally are not sufficiently dense and crystalline as a result of the characteristics of reactive deposition to render them suitable for many semi-conductor, flat panel and opto-electronics applications. The $SiO_2$ film compositions produced by such reactive processes generally exhibit less useful optical, mechanical and chemical durability properties compared to those produced by RF sputtering of non-conductive $SiO_2$ targets.

SUMMARY OF THE INVENTION

It is an object of the present invention to produce articles from $SiO_x$-based material compositions that include a sufficient amount of silicon to render the composition electrically conductive. The $SiO_x$:Si material compositions of this invention are suitable for any application calling for electrically conductive $SiO_x$-based material. One such use is as a target material for use in DC or AC sputtering processes to produce high quality $SiO_x$ thin film coatings with the addition of only small amounts of $O_2$ during the deposition process, since the presence of $SiO_x$ in the target material serves as a source of oxygen in the vessel thereby decreasing the amount of oxygen gas that typically needs to be fed into the vessel during reactive sputtering DC or AC processes. This enables the production efficiencies of DC and AC sputtering to be used to produce $SiO_x$ coatings equivalent to those produced by the less efficient and more costly RF sputtering method.

The $SiO_x$:Si material of the invention is composed of the constituent materials of electrically non-conductive $SiO_x$ and an amount of Si that has been doped and combined with the $SiO_x$ in a manner that physically unites the materials to render the overall $SiO_x$-based composition electrically conductive. In some embodiments, there can be the addition of one or more metals in amounts smaller than that of the Si component. These material compositions, although primarily composed of insulating silicon dioxide, exhibit good electrical conductivity while retaining many of the other intrinsic material properties of the silicon dioxide. Such materials can be fabricated in solid bulk forms such as plates, rods and tubes. In addition these bulk materials can be reduced to powder form with such powders retaining the electrically conductive properties of the bulk material for use alone or with other materials in the formation of various articles of manufacture.

Accordingly, it is an object of the present invention to produce articles from composite $SiO_x$:Si material which, although primarily composed of insulating $SiO_x$ material, has good electrical conductivity due to the presence of the Si material. This material may find use in many applications which require the optical, thermal, mechanical, or chemical properties of $SiO_x$ but which also require electrical conductivity to be useful. The electronic properties of this material can be adjusted based on the ratio of the constituents of electrically conductive doped Si, $SiO_x$ and in some embodiments small fractions of various metals.

BRIEF DESCRIPTION OF THE DRAWINGS

These and other features and advantages of the present invention will become more readily appreciated when considered in connection with the following detailed description and appended drawing, wherein.

DETAILED DESCRIPTION OF THE PREFERRED EMBODIMENT

Figure 1:
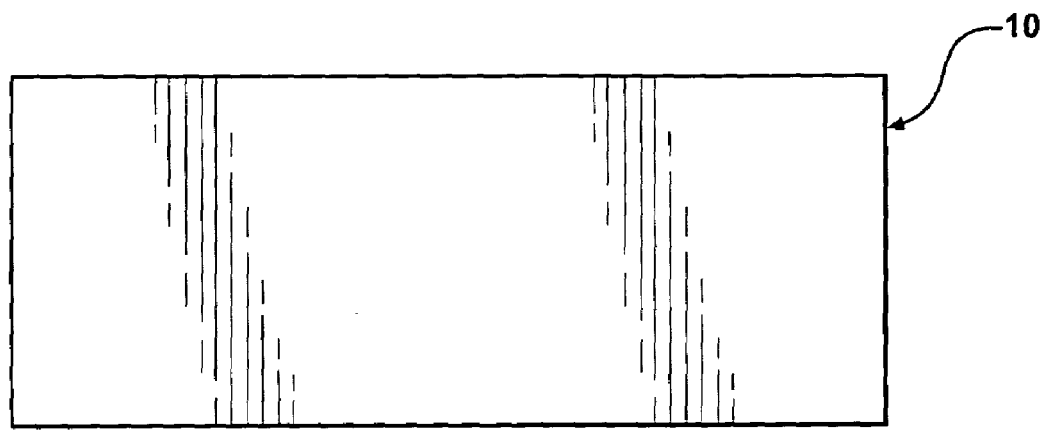
FIG. 1 is a schematic illustration of an article made of the Si:SiO$_x$ material.

The present invention is directed to the manufacture of articles from composite silicon oxide:silicon ($SiO_x$:Si) material that is rendered conductive by the selection of starting materials and the process by which they are combined to form the composite.

According to the fundamental principals of the present invention, the process starts out with $SiO_x$ powder which in and of itself is substantially electrically non-conductive, but which is combined with electrically conductive Si in a manner that protects the Si against substantial oxidation while uniting it to the $SiO_x$ material to render the overall composite electrically conductive while preserving the characteristics of each of the $SiO_x$ and Si materials.

The Si forms a three-dimensional network or grid through the bulk of the Si:$SiO_x$ material that establishes a conductive pathway. These interconnected silicon grains thus exist as a conductive lattice in the presence of the non-conductive $SiO_x$ grains which are united to the Si grains to render the overall material conductive while still preserving the desirable optical characteristics of $SiO_x$ material.

One approach contemplated by the invention starts out with a blend of $SiO_x$ (e.g., $SiO_2$) and conductive Si powders. The blended powder is compacted and fused to form an article which has the properties of being similar to silicon oxide but with low resistivity, and thus they find use in many applications calling for conductive glass articles. For example, one particular usage for such a material is as a sputtering target suitable use in a DC or AC thin film sputtering process.

According to this first presently preferred embodiment of the invention, the conductive silicon component of the powder blend is prepared by crushing and then grinding doped silicon crystal to powder (such as boren p-type doped silicon). As is well known to those skilled in the art, the doping of the silicon material is achieved by adding a suitable n or p dopant to the molten silicon prior to growing the single or poly phase crystal of silicon. The concentration and uniformity of these dopant atoms determine the specific electrical characteristics of the silicon.

The invention contemplates that various approaches can be employed to blend the particles of silicon oxide and conductive silicon and that variations can occur in the size of the particles and the ratio of the silicon oxide to doped silicon particles in order to alter the electrical conductive properties or resistivity of the end product. In the first presently preferred embodiment, the composition of the base silicon oxide powder is greater than 50% by weight, and that of the conductive silicon powder is greater than 10% by weight, with the silicon oxide preferably making up the majority of the powder blend. According to a presently preferred process, the powders may be blended together in a pot using zirconia balls as milling media until the particle size of the blended powder is reduced to less than 5 μm. Once the powder has been sufficiently blended, it is preferably placed in a metal containment unit and then heated under vacuum conditions to eliminate residual moisture. Following heating to drive off the moisture, the containment unit is preferably sealed and then placed in a hot isostatic chamber and then heated to a sufficient temperature and pressure to densify and fuse the silicon oxide and doped silicon particles. For this purpose, the container is preferably one which can withstand the heat and pressure of the hot isostatic-pressing environment, but which flows plastically under the heat and pressure so as to consolidate and densify the powder material contained within the container. Once densified, the resultant fused, densified article of silicon oxide-doped silicon material is removed from the container. The resulting composition is preferably densified to at least 90% of theoretical density, and preferably at least 95% of full theoretical density, and still more preferably greater than 99% of full theoretical density. According to a preferred process, the powder is subjected to hot isostatic pressure (HIP) at temperatures of between 1200 to 1450° C. and under pressures exceeding 20 kpsi. More particularly, the preferred process involves hot isostatic press heating to 1000° C. under vacuum conditions and then gradually applying the pressure to more than 20 kpsi while increasing the temperature to between 1200 to 1350° C. According to a further feature of the invention, the resultant sintered and fused article has a resistivity value of less than 200Ω·cm. Preferably, the article or target has resistivity less than 150106 ·cm and still more preferably below 20Ω·cm and still further more preferably at or below 10Ω·cm. Accordingly, the range of resistivity contemplated by the invention is in the range of about 10Ω·cm or less to about 200Ω·cm.

This material can be prepared by regrinding the sintered $SiO_x$:Si material resulting from the process described above, after which it can be used to form articles by various means such a compacting and sintering in a protective atmosphere that does not oxidize the Si. The $SiO_x$:Si material may alternatively be formed directly in particulate form by a process in which $SiO_x$ particles are coated with molten electrically conductive Si in a protective non-oxidizing atmosphere such as argon to cause the Si to substantially cover the $SiO_x$ particles while protecting the molten Si against oxidation in the process. The resultant composite particles can be mixed with other such particles and/or blended with an amount of uncoated silicon oxide particles and thereafter sintered to form an article. The amount of the conductive composite particles will be that amount which is needed to achieve the desired electrical conductivity properties. For example, the invention contemplates that enough of the composite particles are present to provide a conductive path through the bulk of the sintered material.

Once the article is prepared, it can be used in a number of different applications, such as a target in a direct current (DC) or low to medium frequency alternating (AC) sputtering process for producing silicon oxide coatings.

The invention contemplates that various manufacturing methods can be used to prepare the material that yield the same desirable characteristics and properties described above. These alternative methods can be used with or without the hot isostatic pressing. Such additional processes include vacuum plasma spraying of the Si material onto the $SiO_x$ material in an inert gas atmosphere to preclude oxidizing the Si; vacuum casting ("melt casting") of the materials to connect Si grains of the blend in the presene of the $SiO_x$ grains to yield a conductive network; vacuum hot pressing of the materials in an inert gas atmosphere; and inert gas microwave melting and solidification.

The invention also contemplates various post-treatment methods for rendering the Si conductive in the company of $SiO_2$. In this case the Si is alone in powder form or united with the $SiO_x$ in reground powder form, with the Si initially being non-conductive. One alternative approach for making the silicon conductive is by means of thermal gas diffusion in non-oxygen atmosphere using a gas such as Arsine, $AsH_3$ composition. Another approach is ion implantation with dopants such as Boron. It is also contemplated that the dopant such as Arsenic, Gallium, or Phosphorous could be added in powder form to reground non-conductive Si:$SiO_x$ powder and then sintered in a non-oxygen atmosphere. Still another approach to post-treatment doping of initially non-conductive Si is to mix metal powder such as Al, Mg, Sn, In, Mn, Zn, Bi, Cd, Se, and/or Ga with reground non-conductive Si:$SiO_x$ powder and then sinter in a non-oxygen atmosphere.

The invention also contemplates that additional material can be added to the Si:$SiO_x$ in order to tailor the end properties. For example, to improve density, one could add Al, Mg, Sn, In, Zn, Bi, Sr, Cd, Se and/or Ga. To improve ductility, one could add Al, Mg, Sn, In, Zn, Ga, Se and/or Cd. To alter the refractive index of the Si:SiO$_x$ material, on could add Al and/or Sr. To improve toughness, one could add Al, Mg and/or Se. In each case, the base Si:SiO$_x$ material is itself electrically conductive.

Obviously, many modifications and variations of the present invention are possible in light of the above teachings. It is, therefore, to be understood that within the scope of the appended claims, the invention may be practiced otherwise than as specifically described. The invention is defined by the claims.

What is claimed is:

1. A method of making an article, comprising:
preparing a homogeneous mixture of a plurality of grains of conductive doped silicon and a plurality of grains of at least one oxide of silicon and compacting and sintering the mixture to form a three-dimensional network of conductive doped silicon grains throughout the bulk of the article that are fused to one another and wherein the grains of the at least one oxide of silicon are intermixed with and fused directly to the interconnected network of grains of the conductive silicon throughout the three-dimensional network in a manner that yields a monolithic fused composite material that has a resistivity of about 200Ω·cm or less throughout the bulk of the material.

2. The method of claim 1 including compacting the composite material to at least 90% of full theoretical density.

3. The method of claim 2 including providing the Si initially in powder form and the SiO$_x$ initially in powder form.

4. The method of claim 3 including sizing the Si and SiO$_x$ powders to less than about 5 μm.

5. The method of claim 4 including providing an initial blend of the Si and SiO$_x$ particles in relative amounts such that the SiO$_x$ powder comprises at least about 50% by weight of the blend.

6. The method of claim 4 including providing an initial blend of the Si and SiO$_x$ particles in relative amounts such that the SiO$_x$ powder comprises at least about 50% by weight of the blend but no more than about 80% by weight of the blend.

7. The method of claim 1 including adding at least one metal additive material selected from the group consisting of: Al, Mg, Sn, In, Mn, Zn, Bi, Sr, Cd, Se and Ga.

8. The method of claim 1 wherein there is only one oxide of silicon and it consists of SiO$_2$.

* * * * *

UNITED STATES PATENT AND TRADEMARK OFFICE
CERTIFICATE OF CORRECTION

PATENT NO. : 7,658,822 B2  Page 1 of 1
APPLICATION NO. : 11/201781
DATED : February 9, 2010
INVENTOR(S) : Stevenson et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 26 days.

Signed and Sealed this

Thirtieth Day of November, 2010

David J. Kappos
*Director of the United States Patent and Trademark Office*